(12) United States Patent
Shojaie et al.

(10) Patent No.: US 7,372,133 B2
(45) Date of Patent: May 13, 2008

(54) MICROELECTRONIC PACKAGE HAVING A STIFFENING ELEMENT AND METHOD OF MAKING SAME

(75) Inventors: Saeed Shojaie, Gilbert, AZ (US); Brian Taggart, Phoenix, AZ (US); Dale Hackitt, Mesa, AZ (US)

(73) Assignee: Intel Corporation, Santa Clara, CA (US)

( * ) Notice: Subject to any disclaimer, the term of this patent is extended or adjusted under 35 U.S.C. 154(b) by 75 days.

(21) Appl. No.: 11/292,705

(22) Filed: Dec. 1, 2005

(65) Prior Publication Data

US 2007/0126094 A1 Jun. 7, 2007

(51) Int. Cl.
  *H01L 23/495* (2006.01)
  *H01L 23/28* (2006.01)
  *H01L 23/498* (2006.01)
  *H01L 21/50* (2006.01)
  *H01L 21/48* (2006.01)
  *H01L 21/44* (2006.01)
(52) U.S. Cl. .............. 257/676; 257/666; 257/787; 257/E23.031; 257/E23.043; 257/E23.046; 257/E23.061; 438/106; 438/121; 438/123; 438/124; 438/127
(58) Field of Classification Search .............. 257/730, 257/666, 676, 787, E23.031, E23.043, E23.046, 257/E23.061; 438/106, 121, 123, 124, 127
See application file for complete search history.

(56) References Cited

U.S. PATENT DOCUMENTS

| 6,498,099 | B1 | 12/2002 | McLellan et al. | |
|---|---|---|---|---|
| 6,655,022 | B1* | 12/2003 | Eskildsen et al. | 29/841 |
| 6,717,822 | B1* | 4/2004 | Miks et al. | 361/764 |
| 7,179,682 | B2* | 2/2007 | Foong | 438/106 |
| 7,226,811 | B1* | 6/2007 | McLellan et al. | 438/111 |
| 2002/0149027 | A1* | 10/2002 | Takahashi et al. | 257/100 |
| 2003/0155636 | A1* | 8/2003 | Cobbley et al. | 257/675 |
| 2005/0029657 | A1* | 2/2005 | Khan et al. | 257/738 |
| 2005/0073035 | A1* | 4/2005 | Moxham | 257/678 |
| 2005/0179143 | A1* | 8/2005 | Moxham | 257/782 |

* cited by examiner

*Primary Examiner*—Luan Thai
(74) *Attorney, Agent, or Firm*—Blakely, Sokoloff, Taylor & Zafman LLP

(57) ABSTRACT

A method of forming a leadframe package, a leadframe package formed according to the method, and a system incorporating the leadframe package. The leadframe package includes: a metallization layer comprising a paddle portion and a contact portion including contact leads; a die mounted onto the paddle portion; wirebonds connected between the die and respective ones of the contact leads; an overmold encapsulating the die, the paddle portion, the contact leads and the wirebonds; and a stiffening element encapsulated in the overmold and unconnected to electrical pathways within the leadframe package.

15 Claims, 8 Drawing Sheets

MICROELECTRONIC PACKAGE HAVING A STIFFENING ELEMENT AND METHOD OF MAKING SAME

FIELD

Embodiments of the present invention relate to methods for forming leadframe packages and to packages formed from such methods.

BACKGROUND

According to well known prior art integrated circuit (IC) packaging methodologies, microelectronic dice are singulated and mounted using epoxy or other conventional means onto respective die pads or attach paddles of a leadframe strip. FIG. 1 shows a cross sectional view and a top view of a conventional leadframe package 100. Leadframe package 100 includes a die 110 mounted using die attach epoxy (or other means) 112 onto a die attach paddle 114. The leadframe 100 includes wire bonds 116 that are bonded between die 110 and peripheral leads or contacts 118. An overmold 120 encapsulates the die 110, epoxy 112, paddle 114, contacts 118, and wirebonds 116 as shown, leaving the bottom of contacts 118 exposed for joining with a motherboard.

Disadvantageously, as the length and width of the leadframe packages increases, such as for example, in the case of multi-silicon module packages, that is, in the case of a microelectronic package having a plurality of microelectronic components such as, for example, transistors, capacitors and memory devices, disposed horizontally on the package substrate, the reliability of solder joints between the motherboard and the leadframe becomes a problem. The length and width of a leadframe package may increase for a number of reasons. For example, increasing the number of microelectronic components to integrate added functionality to the leadframe package could increase a size of the package. In addition, an overall footprint of any number of microelectronic components to be integrated into the package could increase by virtue of functionality added to those components. One of the reasons for an adulteration of solder joint reliability is leadframe warping that occurs as the leadframe package dimensions increase. The warpage is typically a result of either (1) a mismatch between the coefficients of thermal expansion of the mold compound encapsulating the package components and the base metal, usually copper, onto which the leadframe package is built; (2) a mismatch between the coefficients of thermal expansion of the leadframe package substrate (for example, silicon) attached to the base metal; or (3) a mismatch between the coefficients of thermal expansion of the overmolded microelectronic device with respect to the underlying motherboard. With respect to point (1) above, when the mold material is provided onto the die, epoxy, paddle, contacts and wirebonds, it is thereafter allowed to cure, typically shrinking at a different rate than the base metal for the leadframe package, in this way bringing about a warpage of the resulting leadframe package. With respect to points (2) and (3) above, since the overmold, package substrate, base metal and motherboard material are made from different materials, they will react differently to the heat generated by the die. The resulting thermal stresses can create a warpage of the leadframe package. A warpage of the leadframe package can ultimately affect the reliability of solder joints joining the contacts of the leadframe package to the underlying motherboard. In particular, when the leadframe package is warped, it has poor coplanarity before being surface mounted onto a motherboard. The result can be poor solder joint formation or even incomplete solder joint formation with the motherboard causing electrical opens, since some joints will be taller while others will be shorter, causing inconsistent loading on joints.

The prior art fails to provide a method of improving solder joint reliability between a leadframe package and the underlying motherboard.

BRIEF DESCRIPTION OF THE DRAWINGS

Embodiments of the invention are illustrated by way of example and not by way of limitation in the figures of the accompanying drawings (not to scale), in which the like references indicate similar elements and in which:

FIG. 2c is a view similar to FIG. 2b showing an alternate embodiment of the leadframe package of FIG. 2a;

DETAILED DESCRIPTION

A method, apparatus, and system for forming a leadframe package with a stiffening element encapsulated in the overmold are disclosed herein.

Various aspects of the illustrative embodiments will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative embodiments. However, it will be apparent to one skilled in the art that the present invention may be practiced without the specific details. In other instances, well-known features are omitted or simplified in order not to obscure the illustrative embodiments.

Various operations will be described as multiple discrete operations, in turn, in a manner that is most helpful in understanding the present invention; however, the order of description should not be construed as to imply that these operations are necessarily order dependent. In particular, these operations need not be performed in the order of presentation.

The phrase "in one embodiment" is used repeatedly. The phrase generally does not refer to the same embodiment, however, it may. The terms "comprising", "having" and "including" are synonymous, unless the context dictates otherwise.

Figure 1:
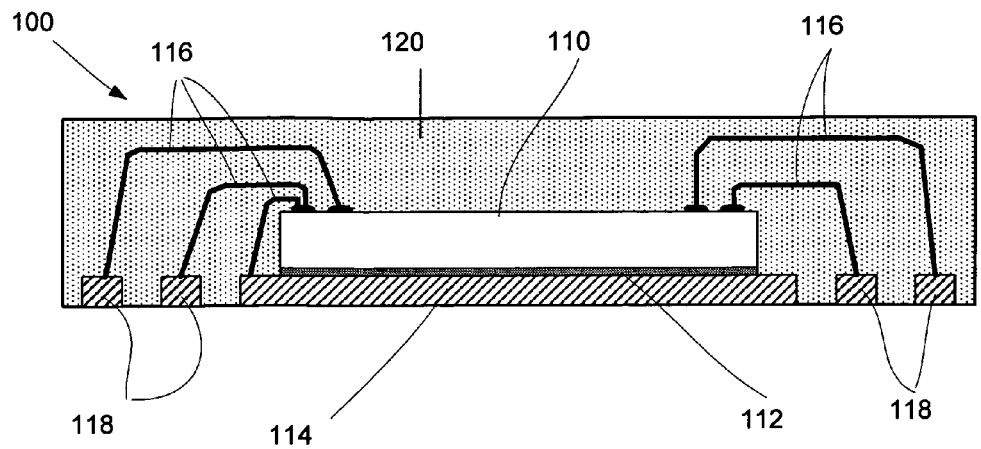
FIG. 1 is a schematic cross-sectional view of a leadframe package according to the prior art.
Figure 2A:
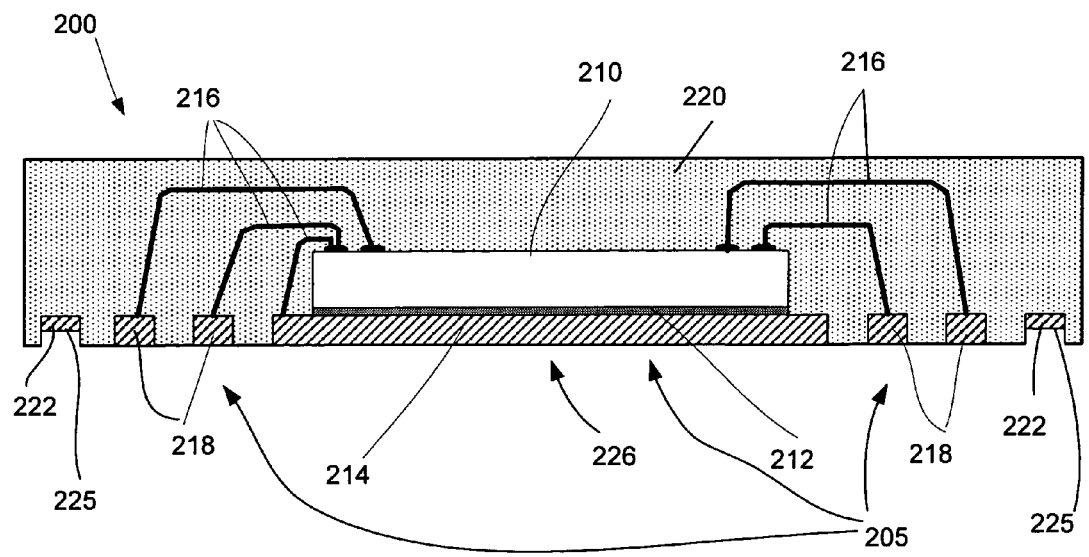
FIG. 2a is a schematic cross-sectional view of a leadframe package according to an embodiment.
Figure 2B:
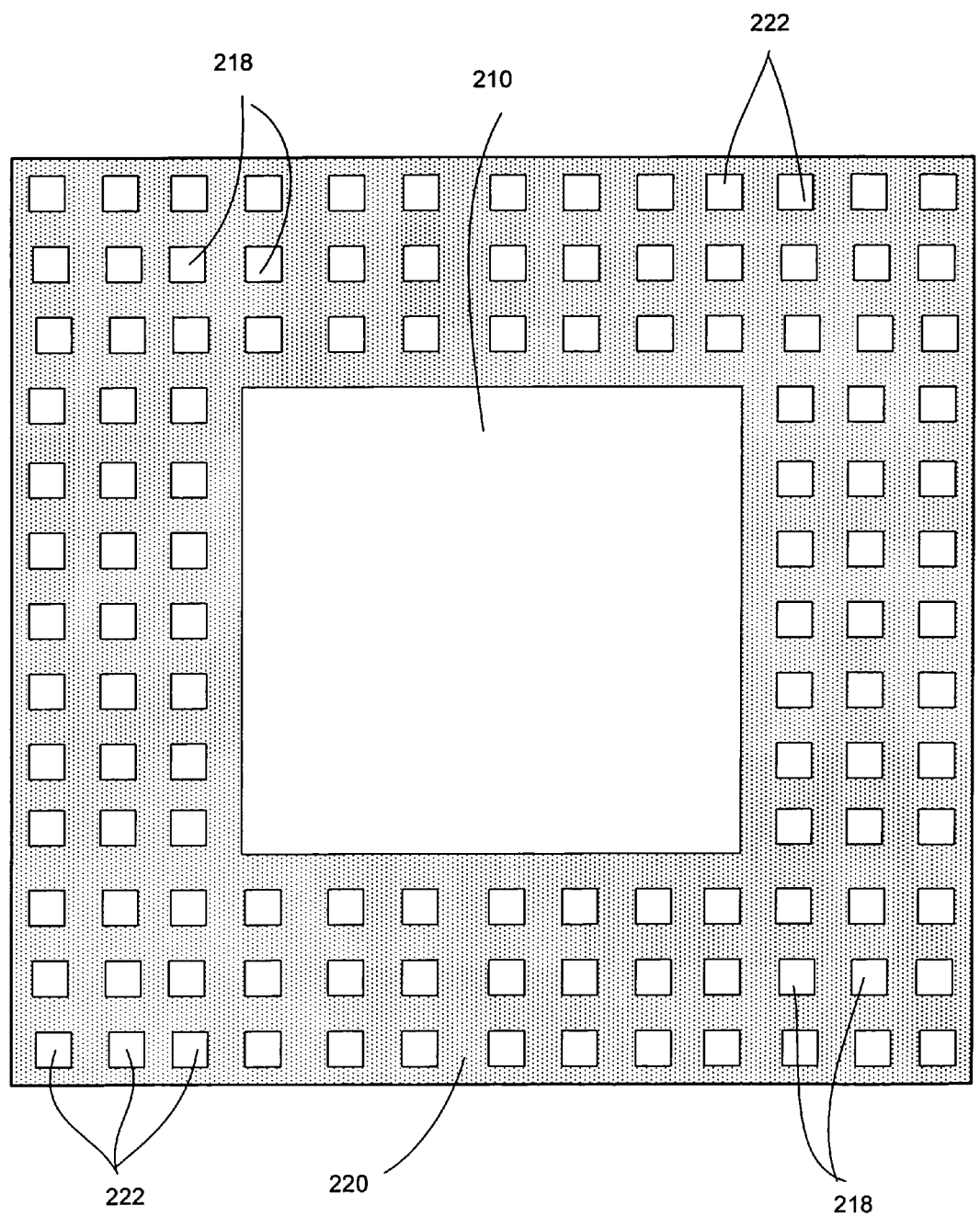
FIG. 2b is a bottom plan view of the leadframe package of FIG. 2a according to one embodiment.
Figure 2C:
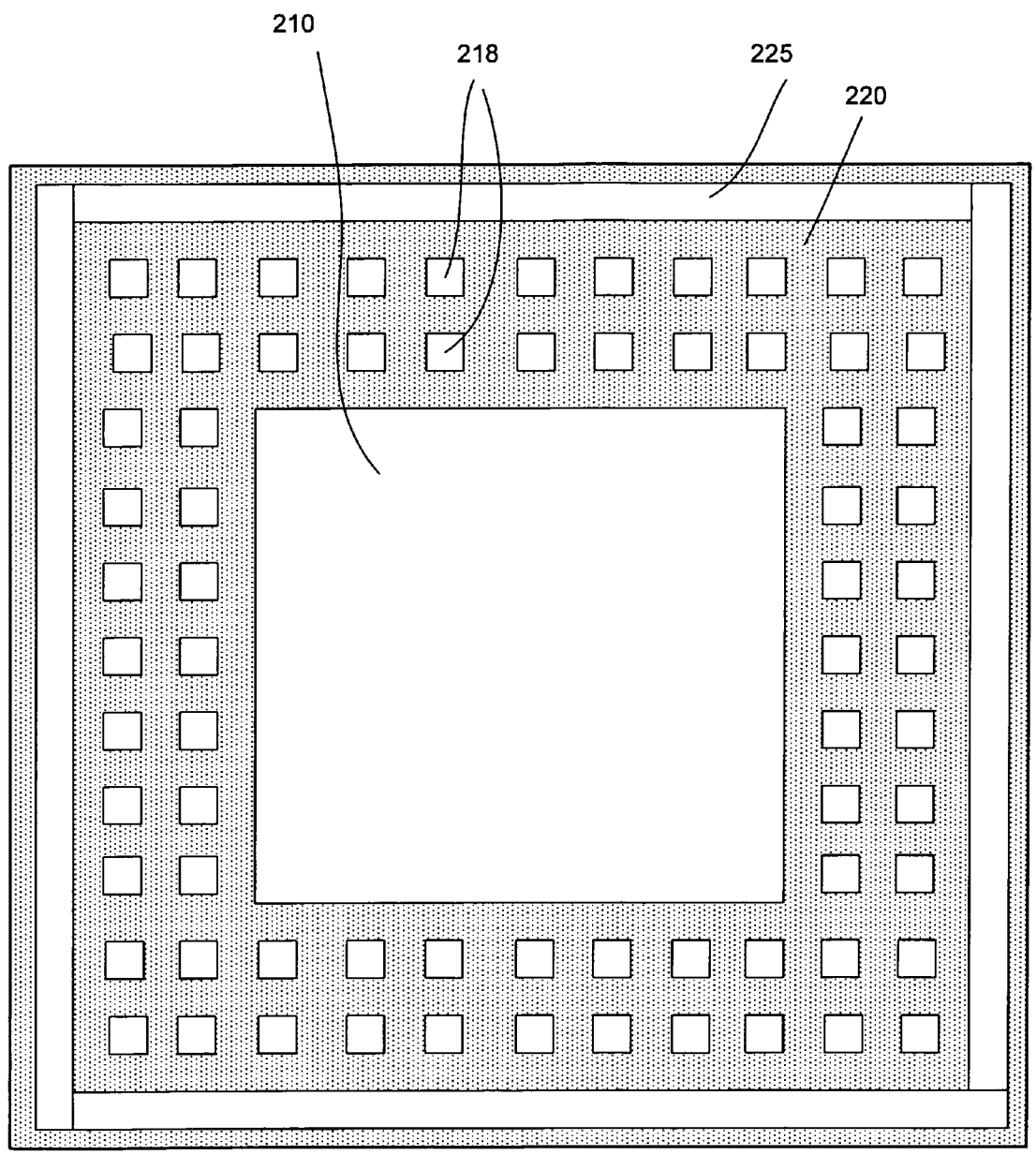

Referring first to FIGS. 2a-2b, a microelectronic leadframe package according to a first embodiment of the present invention is shown. As best seen in FIG. 2a, a leadframe package 200 comprises a metallization layer 205 including die-attach paddle portion 214 and a contact portion including contact leads 218. "Layer" as used throughout the instant description may include one or more layers having a specific function. For example, a "metallization layer" may include one layer of a metallization material, a plurality of layers (or stack) of the same metallization material or of different metallization materials, as long as the resulting structure is a "layer" having a metallization function, that is, a function of providing metallization for establishing electrical pathways. A die 210 is mounted onto the paddle portion 214 such as by way of epoxy 212. Wirebonds 216 are connected between the die 210 and respective ones of the contact leads 218 as shown. Although the leadframe package of FIGS. 2a-2c is shown as including two perimeter patterns of contacts about the paddle, embodiments are not so limited, and include within their scope the provision of any number of perimeter patterns of contacts about the paddle according to application needs. An overmold 220 encapsulates the die 210, the paddle portion 214, the contact leads 218 and the wirebonds 216. The overmold preferably comprises a low stress mold compound, such as, for example, KMC 2500 by Shin-Etsu Chemical Company, Ltd. of Tokyo, Japan, or G760 by Sumitomo Electric of Japan. A stiffening element 225 including stiffening components 222 may also be encapsulated in the overmold, and is unconnected to electrical pathways within the leadframe package.

By "stiffening element," what is meant in the context of the present description is a body made of a material that has a density higher than a density of the overmold, and that is adapted to increase a rigidity of the overall package. A stiffening element according to embodiments may comprise a plurality of stiffening components, such as components shaped similarly to contact leads, as in the case of stiffening components 222 as shown in FIG. 2b, or it may comprise a continuous e element such as that shown in a variation of the first embodiment as shown in FIG. 2c, which is a view similar to FIG. 2b showing an alternate top view of the leadframe package of FIG. 2a. As seen in FIGS. 2a-2c, according to a preferred embodiment, the stiffening element may be disposed to extend symmetrically about the paddle portion. A symmetrical disposition of the stiffening element about the paddle portion advantageously allows a balanced stiffening of the leadframe package by providing a balanced mass distribution of the stiffening element throughout the package. In addition, although the leadframe package of FIG. 2a-2c is shown as including a stiffening element defining a single perimeter pattern about the paddle, embodiments comprise within their scope the provision of a stiffening element including stiffening components defining any number of perimeter patterns about the paddle according to application needs. According to a preferred embodiment, the stiffening element may be made of a metal, such as copper. Referring in particular to FIG. 2a, the stiffening element of the leadframe package of FIGS. 2a is depicted as having been provided in recessed form within corresponding recesses 224 defined in the overmold 220. "Recessed" as used herein refers to a recessing with respect to a motherboard-side surface of the package. A "motherboard-side surface" of the leadframe package denotes a surface of the leadframe package that is adapted to be placed in contact with a motherboard to which the die on the leadframe package is to be electrically and mechanically joined. In the embodiment of FIG. 2a, the motherboard-side surface of the leadframe package 200 corresponds to surface 226 as shown. In the shown embodiment, contact leads 218 have surfaces that are substantially flush with the motherboard-side surface 226, although embodiments are not so limited. Furthermore, embodiments are not limited to a recessed stiffening element, but include within their scope the provision of a stiffening element that has a surface that is substantially flush with a motherboard-side surface of the leadframe package.

The provision of a stiffening element according to embodiments advantageously stiffens a leadframe package comprising the stiffening element by adding density to such package, in this way reducing a potential of warping of the leadframe package that could have occurred without the presence of a stiffening element. As noted above, the warping is typically a result of either a mismatch between the coefficients of thermal expansion of the mold compound encapsulating the package components and the base metal, such as copper, onto which the leadframe package is built, or a mismatch between the coefficients of thermal expansion of the overmold with respect to the underlying motherboard. A warping of the leadframe package can thus ultimately affect a reliability of solder joints joining the contacts of the leadframe package to the underlying motherboard. The provision of a stiffening element about the paddle having a density higher than a density of the overmold material advantageously increases a density of the package and thus provides a structure that has a lower likelihood of warping during and after a curing of the mold material of the overmold. According to a preferred embodiment, the stiffening element may be provided at predetermined locations as a function of a density distribution design of the package to be fabricated in order to minimize warping. According to a more preferred embodiment, the stiffening element may be provided in less populated areas of the package as a function of the layout design of the microelectronic components to be provided on the package.

A method of making a leadframe package according to the embodiments of FIGS. 2a-2c will now be described in reference to FIGS. 3-9d.

Figure 3:
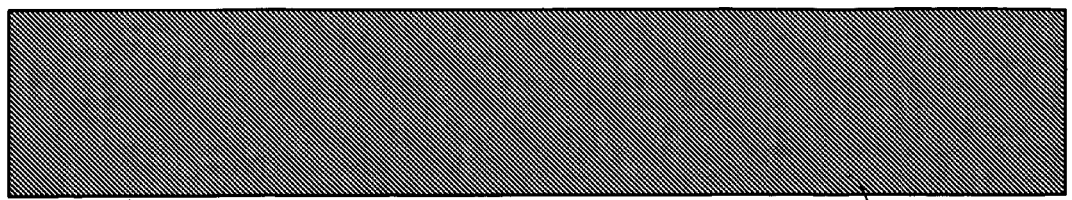
FIGS. 3-9d depict stages in the formation of a leadframe package according to FIGS. 2a-2c.

Referring first to FIG. 3 by way of example, a first stage of making a leadframe package according to embodiments comprises providing a support base, such as support base 230 of FIG. 3. The support base according to embodiments may be sacrificial and may be provided to allow a build-up of the leadframe package thereon prior to being removed. Preferably, the support base is made of copper, although it may be made of any other of the well know materials adapted to be used for the support base, such as, for example, aluminum, nickel or tin.

Figure 4:
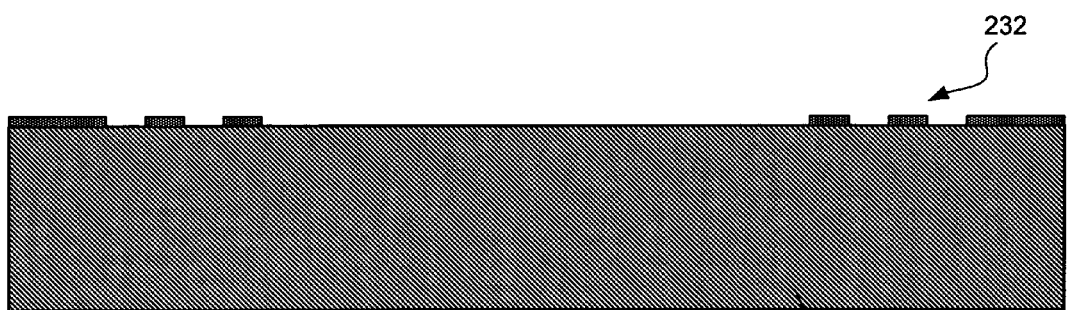

Referring next to FIG. 4 by way of example, a next stage of making a leadframe package according to the embodiments of FIGS. 2a-2c comprises providing a first dry film resist according to a pattern of the metallization layer onto the support base. Thus, as seen in FIG. 4, a dry film resist 232, such as, for example, may be applied to the support base using a rolling application, as would be recognized by one skilled in the art. A pattern of the first dry film resists may thus correspond to a pattern of the metallization layer 205 of FIG. 2a. Embodiments are not limited to the use of a dry film resist to provide an unexposed pattern onto the support base, however, and include within their scope the provision of any suitable mask for providing the unexposed pattern, such as, for example, a liquid mask provided, for example, by way of spraying.

Figure 5:
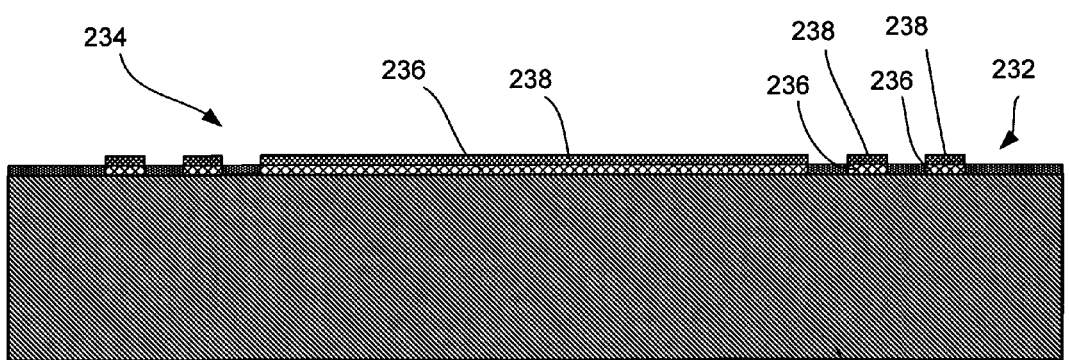

Referring next to FIG. 5 by way of example, a next stage of making a leadframe package according to the embodiments of FIGS. 2a-2c comprises providing a bottom metallization layer on the support base according to the pattern of the first dry film resist. A bottom metallization layer such as layer 234 may be disposed on the support base for example to provide an etch stop layer for any subsequent etching processes, to provide a corrosion resistance layer for the etch stop layer, to provide a migration stop layer for the electrically conductive metallization layer, and to facilitate electrical connection of package components with external circuitry, as would be recognized by one skilled in the art. Providing a bottom metallization layer on the support base may, according to an embodiment, comprise plating the support base according to a pattern of first dry film resist 232. Plating may occur according to techniques well known in the art, such as electroless and/or electrolytic plating and may comprise the provision of a bottom metallization layer such as bottom metallization layer 234 comprising a first bottom metallization sublayer 236 made for example of nickel, and a second bottom metallization sublayer 238 above the first bottom metallization sublayer 236 made for example of gold. Nickel, for example, is known for its etch stop characteristics, and for preventing copper migration which could lead to corrosion. Gold, on the other hand, is known for example for providing a corrosion resistance layer for the nickel layer, and to provide a better "wetting" material for making a gold wire connection between the package components and the leads. Any other suitable method of providing the bottom metallization layer may be used, as would be recognized by one skilled in the art, including methods not involving the use of a dry film resist, such as, for example, any one of a subtractive, a semi subtractive, and a semi-additive patterning process, as would be within the knowledge of one skilled in the art. Although the embodiment of FIG. 2a and the structure shown in FIG. 5 depict the provision of a bottom metallization layer according to a first embodiment, embodiments of the present invention are not limited to the provision of a bottom metallization layer, and may involve the provision of a main metallization layer and of a stiffening layer made of a single material, such as copper, and such as by way of plating through a dry film resist. By "main metallization layer," what is meant in the context of the present description is a conductive layer that is adapted to provide a majority of the electrical pathway function of the metallization layer.

Figure 6:
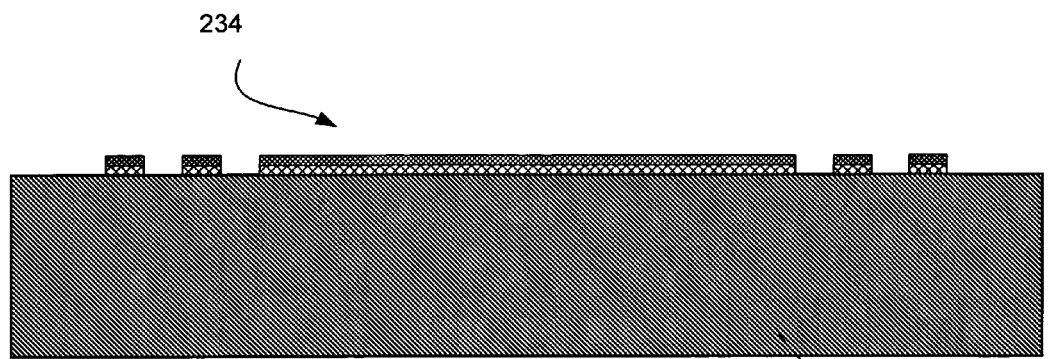

Referring now to FIG. 6 by way of example, a next stage of making a leadframe package according to the embodiments of FIGS. 2a-2c comprises stripping the dry film from the support base. Thus, as seen in FIG. 6, the dry film layer 232 may be stripped from the support base 230, such as by using a chemical such as NaOH to make the resist swell and fall off the base metal. A stripping of the dry film resist according to the shown method embodiment would leave a support base 230 including a bottom metallization layer 234 thereon.

Figure 7:
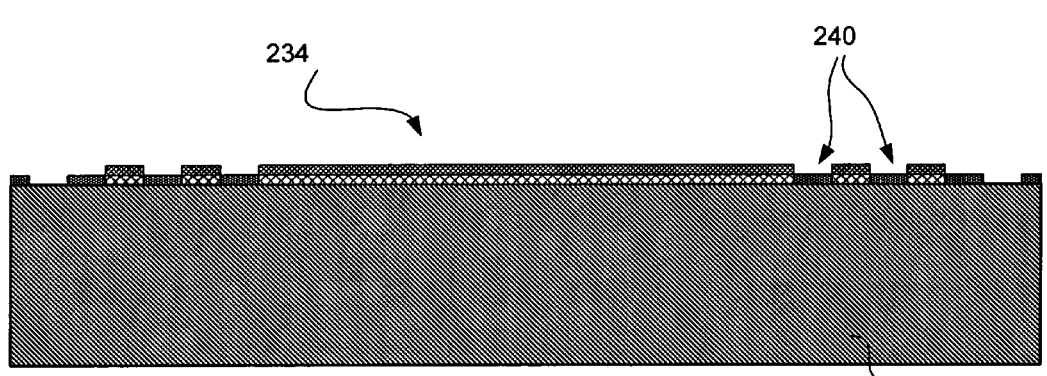

Referring next to FIG. 7 by way of example, a next stage of making a leadframe package according to the embodiments of FIGS. 2a-2c comprises providing a onto the support base a second dry film resist according to both a pattern of the metallization layer and a pattern of the stiffening element. Thus, as seen by way of example in FIG. 7, a second dry film resist 240 may be provided onto support base 230, the second dry film resist 240, as seen in FIG. 7, having a pattern of the metallization layer and thus leaving exposed the bottom metallization layer 234, and further having a pattern of the stiffening element, as seen by exposed spaces 242 in the resist.

Figure 8:
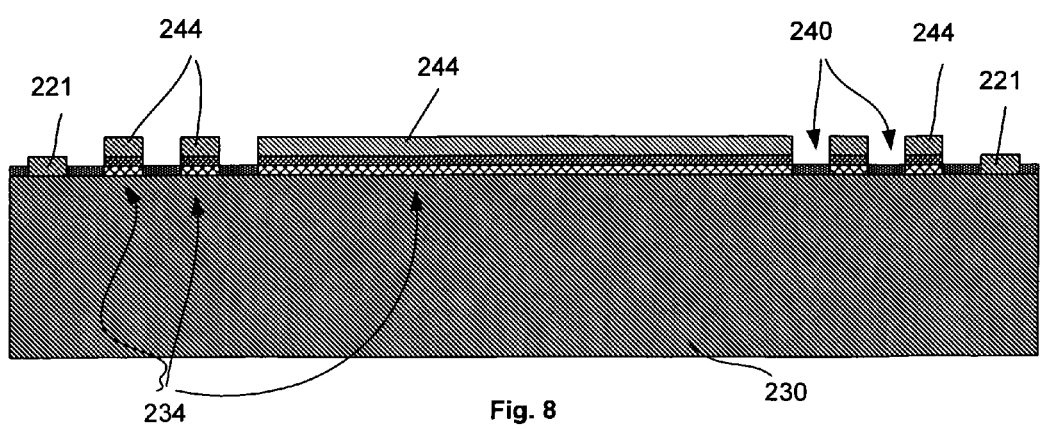

Referring next to FIG. 8 by way of example, a next stage of making a leadframe package according to the embodiments of FIGS. 2a-2c comprises providing a main metallization layer onto the bottom metallization layer. Thus, as seen in FIG. 8, a main metallization layer 244 may be provided onto bottom metallization layer 234 as shown. According to a preferred embodiment, the main metallization layer may comprise copper. The main metallization layer may be provided by way of plating, such as, for example, by way of electroless and/or electrolytic plating, or by other techniques such as a subtractive, a semi subtractive, or a semi-additive process, as would be within the knowledge of one skilled in the art. A provision of the main metallization layer may be effected, however, according to any one of well known methods not necessarily involving the provision of a dry film resist and/or electroless or electrolytic plating.

Referring again to FIG. 8 by way of example, a next stage of making a leadframe package according to the embodiment of FIG. 2a comprises providing a stiffening element onto the support base. The stiffening element thus provided my either be further processed, such as, for example, by being recessed as explained further below, or it may be unprocessed after its provision onto the support base. In the shown embodiment, the provided stiffening element is in the form of a stiffening layer 221. According to a preferred embodiment, a stiffening layer may be provided during a provision of the first metallization layer through the second dry film resist, such as through electroless and/or electrolytically plating the stiffening layer onto the support base. Preferably, the stiffening layer comprises copper. Other materials adapted to be used for the stiffening layer may comprise, by way of example, nickel, tin or aluminum.

Figure 9A:
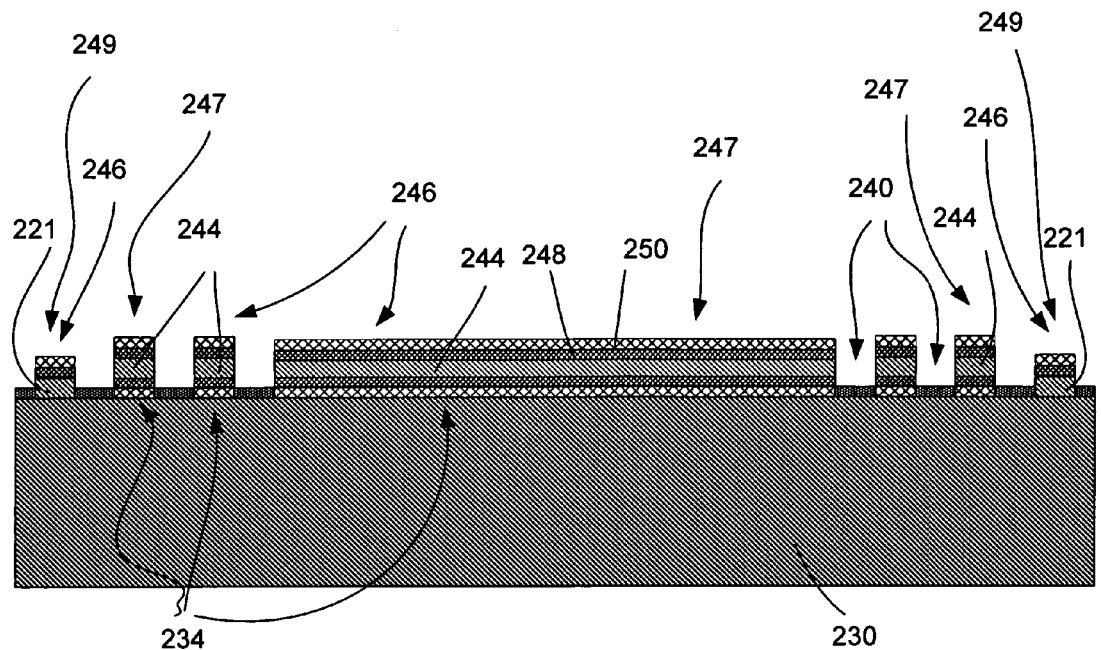

Referring next to FIG. 9a, a subsequent stage of making a leadframe package according to the embodiment of FIG. 2a comprises providing a top metallic layer on the main metallization layer and on the stiffening layer according to the pattern of the second dry film resist. A top metallic layer such as layer 246 may comprise, as shown in the embodiment of FIG. 9a, a top metallization portion 247 on the main metallization layer, and a top metallic portion 249 on the stiffening layer. The top metallization portion 247 may be provided for the same reasons as outlined above with respect to the provision of a bottom metallization layer, as would be recognized by one skilled in the art. The top metallic portion 249 is provided onto the stiffening layer by virtue of the stiffening layer not having been covered with a resist during provision of the top metallization portion 247. Providing a top metallic layer may, according to an embodiment, comprise plating according to a pattern of second dry film resist 240. Plating may occur according to techniques well known in the art, such as electroless and/or electrolytic plating and may comprise the provision of a top metallic layer, such as top metallic layer 246 comprising a first top metallic sublayer 248 made for example of gold, and a second top metallic sublayer 250 above the first top metallic sublayer 236 made for example of nickel. Any other suitable method of providing the top metallic layer may be used, as would be recognized by one skilled in the art, including methods not involving the use of a dry film resist. Although the embodiment of FIG. 2a and the structure shown in FIG. 9a depict the provision of a top metallic layer, embodiments of the present invention are not so limited, and may involve, as previously noted, the provision of a main metallization layer made of a single material, such as copper, and such as by way of plating through a dry film resist, or the provision of a top metallic layer that consists of the top metallic layer or of the top metallization layer but not of both.

Figure 9B:
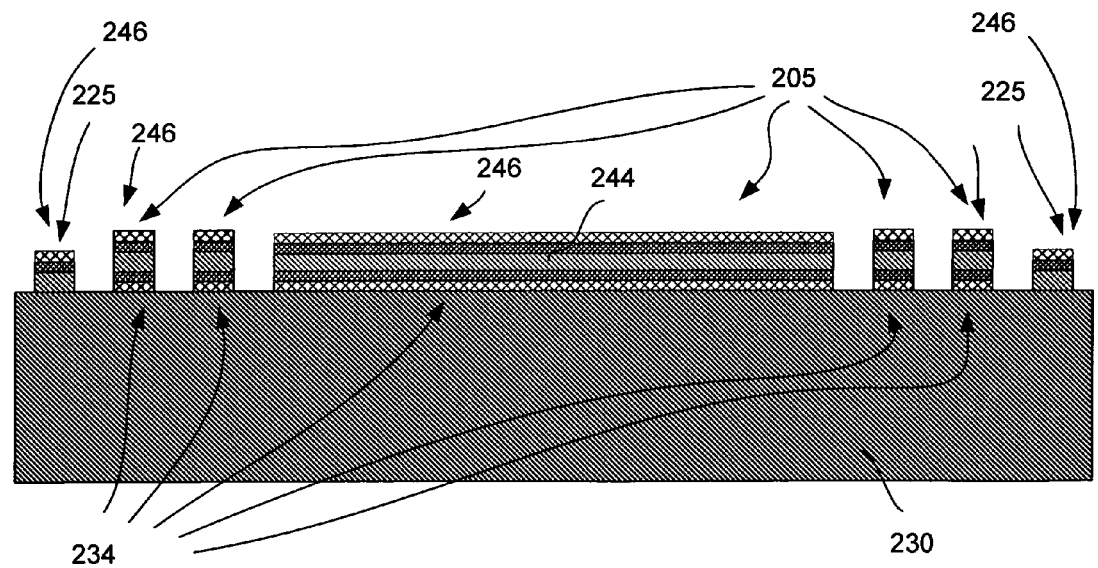

Referring now to FIG. 9b by way of example, a next stage of making a leadframe package according to the embodiments of FIGS. 2a-2c, comprises stripping the second dry film from the support base. Thus, as seen in FIG. 9b, the dry film layer 240 may be stripped from the support base 230, such as by using a chemical such as NaOH to make the resist swell and fall off. A stripping of the dry film resist according to the shown method embodiment would leave a support base 230 including a metallization layer 205 and a stiffening layer 221 on the support base, the metallization layer comprising bottom metallization layer 234, main metallization layer 205 and a portion of top metallization layer 246, and the stripping layer additionally including a remaining portion of top metallization layer 246 as shown.

Figure 9C:
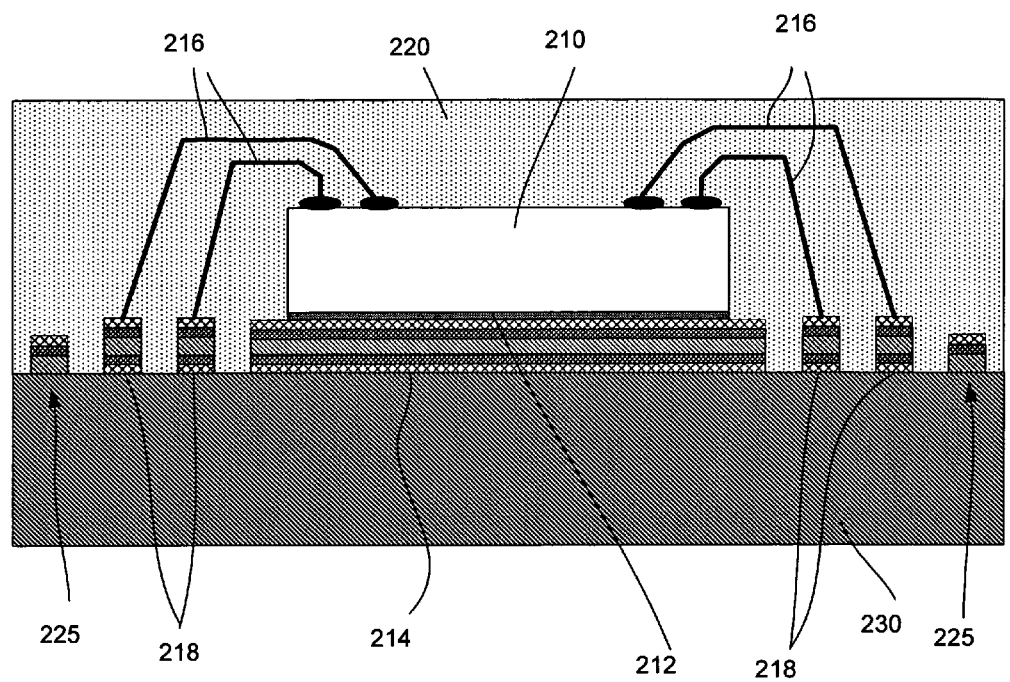

Referring next to FIG. 9c by way of example, a subsequent stage of making a leadframe package according to the embodiment of FIG. 2a comprises mounting a die to the paddle portion, connecting wirebonds between the die and respective ones of the contact leads, and encapsulating the die, contact leads, stiffening layer and wirebonds in an overmold. Thus, as seen in FIG. 9c, die 210 is shown as having been mounted onto the paddle portion 214 using epoxy 212 (or another similar bonding material). Wirebonds 216 are shown as having been connected between the die 210 and respective ones of the contact leads 218. In addition, the die 210, contact leads 218, stiffening layer 221 and wirebonds 216 are shown as having been encapsulated in an overmold 210. A mounting of the die, connection of wirebonds and encapsulation in an overmold may be affected according to any one of methods well known to a person skilled in the art.

Figure 9D:
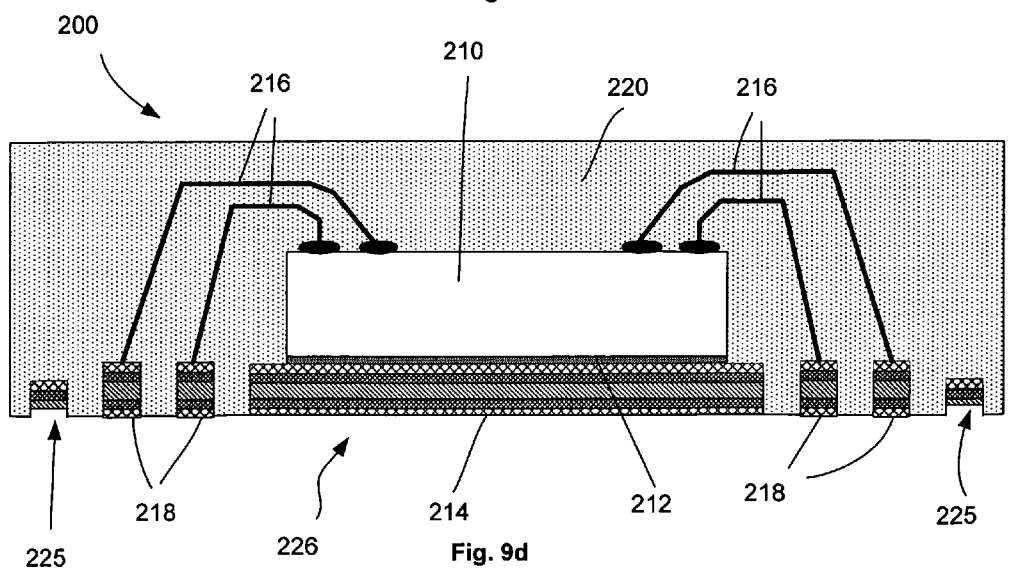

Referring next to FIG. 9d by way of example, a subsequent stage of making a leadframe package according to the embodiment of FIG. 2a comprises removing the support base. Thus, as seen in FIG. 9d, the support base 230 may be removed according to any one of methods well known in the art, such as, for example, by way of etching. For example, where the support base is made of copper, a removal of the support base may for example be effected by using a HCl, H2O2, H2SO4 etch. Optionally, as also shown in FIG. 9d, the stiffening layer 221 may also be at least partially removed such that they are recessed into the overmold in a direction away from the motherboard-side surface 226. According to a preferred embodiment, a recessing of the stiffening element 225 may occur by way of etching. A recessing of the stiffening element 225 may thus result in a recessed stiffening element 222. As noted above, a recessing of the stiffening element can advantageously be effected where needed based on a modeling of warpage for each unique leadframe package design in order to optimize a warpage reduction of the package.

A removal of the support base as shown by way of example in FIG. 9d, and an optional recessing of the stiffening element, provides the leadframe package of FIG. 9d, which corresponds to the leadframe package of FIG. 2a but shown in further detail.

It is noted that although the stages depicted in FIGS. 3-9d pertain to the making of the leadframe package of FIGS. 2a-2c, techniques discussed with respect to those figures may apply to any one of possible embodiments of the present invention. A method according to embodiments thus comprises: (1) the provision of a support layer, such as, for example, in the manner discussed with respect to FIG. 3); (2) the provision of a metallization layer including a main metallization layer, such as, for example, in the manner discussed with respect to FIGS. 7 and 8 (and also optionally including a bottom metallization layer such as, for example, discussed with respect to FIGS. 5 and 6, and, optionally including a top metallization portion such as, for example, discussed with respect to FIGS. 9a and 9b); (3) the provision of a stiffening element, such as, for example, in the manner discussed with respect to FIGS. 7 and 8 (which may optionally include the provision of a top metallic portion, such as, for example, in the manner discussed with respect to FIGS. 9a and 9b, and optionally include a recessing, such as, for example, in the manner discussed with respect to FIG. 9d); (4) mounting the die to the paddle portion, connecting the wirebonds and encapsulating the die, paddle portion, contact leads and stiffening element, such as, for example, in the manner discussed with respect to FIG. 9c; and (5) removing the support base, such as, for example, in the manner discussed with respect to FIG. 9d. It is thus noted that the stages of FIGS. 3-9d are merely examples, and that items (1) through (5) above may be performed according to any one of the techniques that would be within the knowledge of a person skilled in the art. In addition, it is noted that embodiments are not limited to a forming of a single package, and comprise within their scope a method of forming as outlined above in which a plurality of leadframe package according to embodiments are fabricated, such as in a high volume manufacturing environment.

Figure 10:
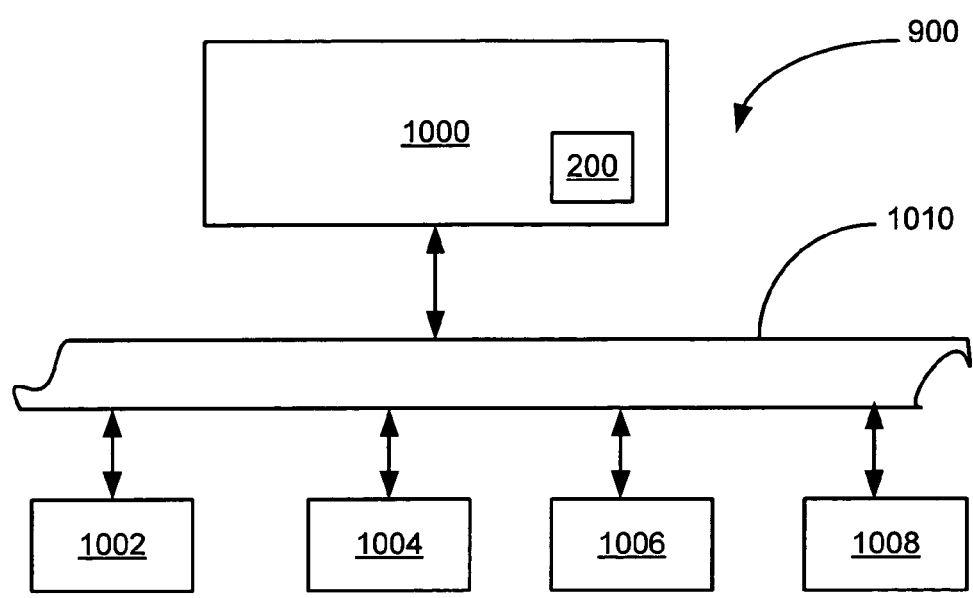
FIG. 10 is a schematic depiction of a system incorporating a leadframe package according to an embodiment.

Referring to FIG. 10, there is illustrated one of many possible systems 900 in which embodiments of the present invention may be used. System 900 includes an electronic assembly 1000 including a leadframe package such as leadframe package 200 of FIGS. 2a and 9d. In one embodiment, the electronic assembly 1000 may include a microprocessor. In an alternate embodiment, the electronic assembly 1000 may include an application specific IC (ASIC). Integrated circuits found in chipsets (e.g., graphics, sound, and control chipsets) may also be packaged in accordance with embodiments of this invention.

For the embodiment depicted by FIG. 10, the system 900 may also include a main memory 1002, a graphics processor 1004, a mass storage device 1006, and/or an input/output module 1008 coupled to each other by way of a bus 1010, as shown. Examples of the memory 1002 include but are not limited to static random access memory (SRAM) and dynamic random access memory (DRAM). Examples of the mass storage device 1006 include but are not limited to a hard disk drive, a compact disk drive (CD), a digital versatile disk drive (DVD), and so forth. Examples of the input/output module 1008 include but are not limited to a keyboard, cursor control arrangements, a display, a network interface, and so forth. Examples of the bus 1010 include but are not limited to a peripheral control interface (PCI) bus, and Industry Standard Architecture (ISA) bus, and so forth. In various embodiments, the system 900 may be a wireless mobile phone, a personal digital assistant, a pocket PC, a tablet PC, a notebook PC, a desktop computer, a set-top box, a media-center PC, a DVD player, and a server.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. A microelectronic leadframe package comprising:
a metallization layer comprising a paddle portion and a contact portion including contact leads;
a die mounted onto the paddle portion;
wirebonds connected between the die and respective ones of the contact leads;

an overmold encapsulating the die, the paddle portion, the contact leads and the wirebonds; and a stiffening element unconnected to electrical pathways within the leadframe package, the stiffening element being placed within a recess defined in the overmold with respect to a motherboard-side surface of the overmold.

2. The package of claim 1, wherein the metallization layer comprises a copper layer.

3. The package of claim 2, wherein the metallization layer comprises a bottom metallization layer comprising one or more metal layers and disposed at a motherboard-side of the copper layer.

4. The package of claim 3, wherein the metallization layer comprises a top metallization layer comprising one or more metal layers and disposed at a die-side of the copper layer.

5. The package of claim 3, wherein the bottom metallization layer comprises a gold layer adjacent the copper layer and a nickel layer on the gold layer.

6. The package of claim 4, wherein the top metallization layer comprises a nickel layer adjacent the copper layer and a gold layer on the nickel layer.

7. The package of claim 1, wherein the stiffening element comprises a metal.

8. The package of claim 1, wherein the stiffening element comprises a plurality of stiffening components.

9. The package of claim 1, wherein the stiffening element is disposed to extend symmetrically about the paddle portion.

10. The package of claim 1, wherein the stiffening element defines at least one perimeter pattern about the paddle portion.

11. A system comprising:

an electronic assembly comprising a microelectronic leadframe package including:

a metallization layer comprising a paddle portion and a contact portion including contact leads;

a die mounted onto the paddle portion;

wirebonds connected between the die and respective ones of the contact leads;

an overmold encapsulating the die, the paddle portion, the contact leads and the wirebonds; and a stiffening element unconnected to electrical pathways within the leadframe package, the stiffening element being placed within a recess defined in the overmold with respect to a motherboard-side surface of the overmold; and a main memory coupled to the electronic assembly.

12. The system of claim 11, wherein the stiffening element is a stiffening layer.

13. The system of claim 11, wherein the stiffening element comprises a plurality of stiffening components.

14. The system of claim 11, wherein the stiffening element is disposed to extend symmetrically about the paddle portion.

15. The system of claim 11, wherein the stiffening element defines at least one perimeter pattern about the paddle portion.

* * * * *